(12) United States Patent
Toshima et al.

(10) Patent No.: US 8,384,207 B2
(45) Date of Patent: Feb. 26, 2013

(54) SEMICONDUCTOR INTEGRATED CIRCUIT DEVICE HAVING INSULATED THROUGH WIRES

(75) Inventors: Hiroyuki Toshima, Wako (JP); Natsuo Nakamura, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 589 days.

(21) Appl. No.: 11/988,012

(22) PCT Filed: Aug. 23, 2006

(86) PCT No.: PCT/JP2006/317032
§ 371 (c)(1),
(2), (4) Date: Mar. 7, 2008

(87) PCT Pub. No.: WO2007/024009
PCT Pub. Date: Mar. 1, 2007

(65) Prior Publication Data
US 2009/0114988 A1 May 7, 2009

(30) Foreign Application Priority Data
Aug. 26, 2005 (JP) ................ P2005-246492

(51) Int. Cl.
*H01L 23/04* (2006.01)
*H01L 29/40* (2006.01)
(52) U.S. Cl. ................ 257/698; 257/621
(58) Field of Classification Search .......... 257/621, 257/698, 699, E21.597, E23.011, E23.145, 257/E23.174
See application file for complete search history.

(56) References Cited

U.S. PATENT DOCUMENTS

| 5,998,292 | A | 12/1999 | Black et al. |
| 6,087,719 | A * | 7/2000 | Tsunashima ............... 257/686 |
| 6,252,300 | B1 * | 6/2001 | Hsuan et al. ............... 257/686 |
| 2002/0028532 | A1 | 3/2002 | Tsunashima |
| 2003/0210534 | A1 * | 11/2003 | Swan et al. ............... 361/807 |
| 2004/0188822 | A1 * | 9/2004 | Hara ............... 257/689 |
| 2005/0101054 | A1 | 5/2005 | Mastromatteo et al. |

FOREIGN PATENT DOCUMENTS

| EP | 1 306 901 A2 | 10/2002 |
| JP | 11-261000 A | 9/1999 |
| JP | 2003/151978 A | 5/2003 |

* cited by examiner

*Primary Examiner* — Hung Vu
(74) *Attorney, Agent, or Firm* — Birch, Stewart, Kolasch & Birch, LLP

(57) ABSTRACT

A semiconductor integrated circuit device (10) which has a layered structure is composed of a plurality of semiconductor layers (L1, L2, L3) in which an integrated circuit is formed on a substrate. Each of the semiconductor layers (L1, L2, L3) has a semiconductor integrated circuit portion (16) that includes the abovementioned integrated circuit on a substrate (11). Each of the semiconductor layers (L1, L2, L3) also has on a substrate at least one unit of through-wiring (17a) for electrically connecting the integrated circuit included in the semiconductor integrated circuit portion (16) to an integrated circuit of another semiconductor layer, and a surrounding insulation portion (18) for surrounding and insulating the through-wiring from the semiconductor integrated circuit portion. A structure formed by the surrounding insulation portion (18) and the through-wiring portion (17) composed of a plurality of units of through-wiring (17a) reduces the resistance of the through-wiring portion and increases the degree of integration of a circuit.

19 Claims, 7 Drawing Sheets

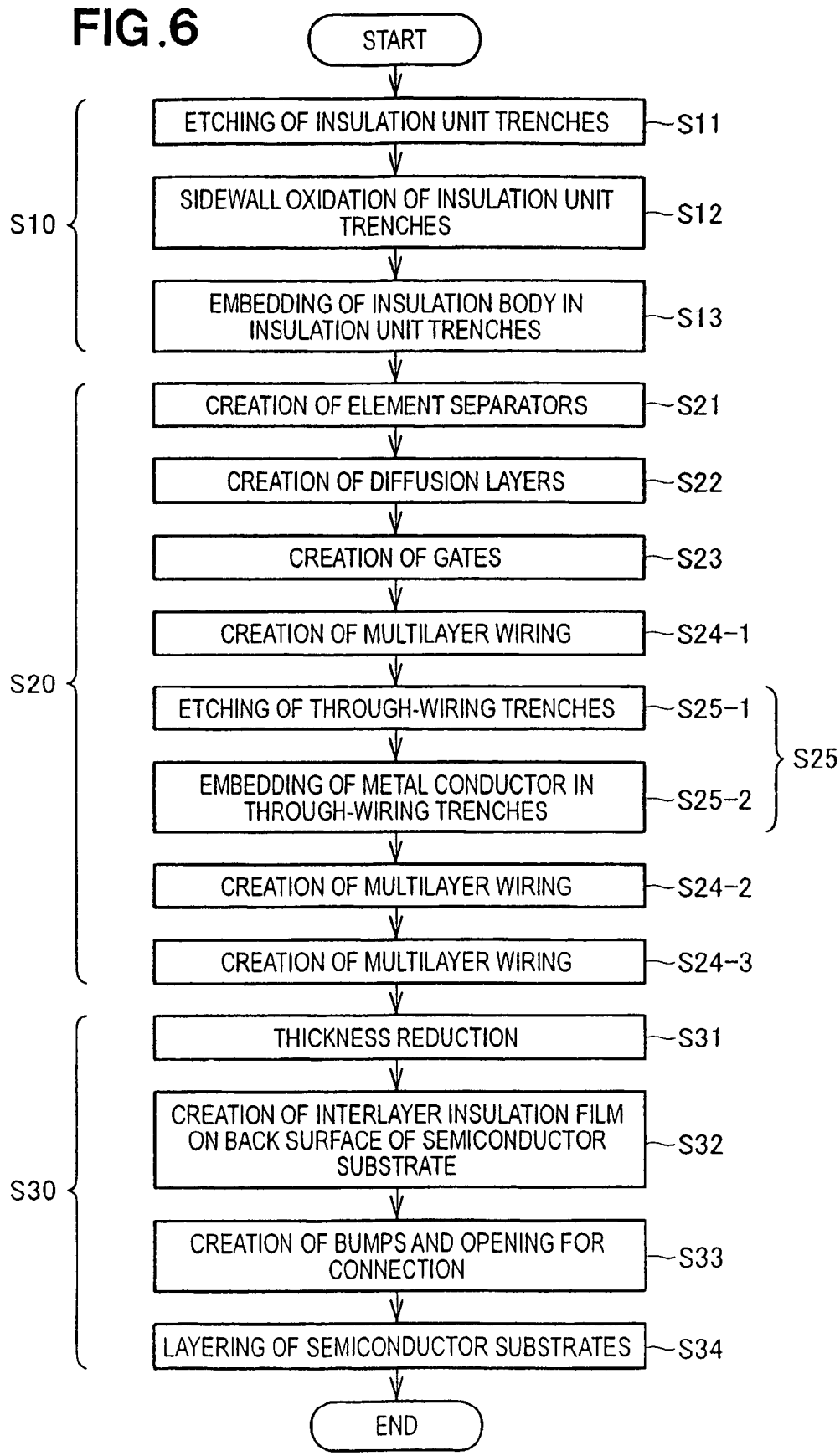

SEMICONDUCTOR INTEGRATED CIRCUIT DEVICE HAVING INSULATED THROUGH WIRES

TECHNICAL FIELD

The present invention relates to a semiconductor integrated circuit device and to a method for manufacturing the same, and particularly relates to a semiconductor integrated circuit device having a three-dimensional structure in which a plurality of semiconductor integrated circuit layers is layered together, and to a method for manufacturing the same.

BACKGROUND ART

Conventional three-dimensional semiconductor integrated circuit devices are known in which, two or more wafers are layered vertically, and the wafers are electrically connected to each other in the vertical direction by through-wiring (see, for example, Japanese Patent Laid-Open Publication No. 11-261000).

According to the method for manufacturing a three-dimensional semiconductor integrated circuit device described in the 11-261000 publication, an upper LSI wafer layer and a lower LSI wafer layer are prepared, and a trench (deep groove) is formed in the upper LSI wafer layer, after which a vertical interconnector (through-wiring) used for wiring is embedded in the trench. A bump is then formed at an end of the vertical interconnector, and the upper LSI wafer layer is affixed to the lower LSI wafer layer via the bump. An insulating adhesive is finally injected between the upper and lower LSI wafers affixed to each other only by the bump.

Following is a description of drawbacks relating to the "sequence of steps" in the conventional method for manufacturing a three-dimensional semiconductor integrated circuit device.

In the case of the method for manufacturing a three-dimensional semiconductor integrated circuit device disclosed in the abovementioned reference, the sidewalls of each trench are first oxidized to provide an insulation film, and then a metal is deposited into the trenches to complete the through-wiring. A semiconductor integrated circuit that includes a transistor and other elements is then formed.

However, when through-wiring and a semiconductor integrated circuit are formed according to a sequence of steps such as the one described above, high temperatures of about 800 to 1000° C. occur in the process of manufacturing the transistor and other elements. Therefore, the metal constituting the through-wiring formed in the previous stage is scattered into the transistor region by this high-temperature process, possibly resulting in metal contamination of the transistor region. This metal contamination causes fluctuation of the electrical characteristics of elements in regions other than that of the through-wiring.

Drawbacks also occur when the through-wiring formed out of metal is completed before or during formation of the transistor, in that only an extremely limited range of materials such as titanium, nickel, cobalt, tungsten, and the like can be used as the metal, for the through-wiring without adversely affecting the transistor characteristics.

In order to avoid the abovementioned drawbacks caused by the through-wiring being composed of a metal, the through-wiring may be formed by embedding, a polysilicon or other nonmetal conductive substance in the trenches instead of a metal.

However, polysilicon and other nonmetal conductive substances have higher resistance than metals. Using a substance with higher resistance than metal to form the through-wiring in this manner leads to drawbacks of increased power consumption and reduced operating speed in a device in which the semiconductor integrated circuit is used.

A method may also be used in which the sequence of steps is fundamentally changed in order to overcome all of the drawbacks described above. For example, an insulation film may be formed by high-temperature oxidation of the sidewalls of the trench after the semiconductor integrated circuit is formed, and the through-wiring may be completed by embedding a metal into the trench.

In this type of method, however, since the step for forming the insulation film on the trench sidewalls involves processing at high temperatures of approximately 800° C. or higher, ion implantation and other processes induce re-diffusion of the impurity (dopant) region formed in the transistor region of the semiconductor integrated circuit. This phenomenon also causes the transistor characteristics to fluctuate.

For a trench having a low aspect ratio, it is possible to form an insulation film on the sidewall without performing high-temperature, oxidation treatment. However, the formation of through-wiring that utilizes a low-aspect-ratio trench severely reduces the degree of integration of the semiconductor integrated circuit device, and thus introduces drawbacks from another perspective.

A combination in which the steps are arranged in the following sequence is considered in order to overcome all of the abovementioned drawbacks at once: "trench formation"→"sidewall oxidation"→"transistor formation"→"formation of through-wiring by metal filling." In this case, however, lithography processing, washing that accompanies resist removal, and other types of processing are performed while the trench is still in an open state. Therefore, the photoresist, developing solution, and other substances used in these processes are left behind in the trench.

It may be possible to provide a step for forming a film cap of an oxide such as $SiO_2$ on the open portion of each trench, and a step for subsequently removing the cap in order to prevent the photoresist and other substances from remaining in the trenches. However, these steps are extremely difficult to provide technologically, and providing these steps significantly alters the conditions for flattening the top of the semiconductor substrate, thereby creating new drawbacks.

The drawbacks of the prior art relating to "alignment tolerance" will next be described. Wiring is patterned by exposure treatment in a method for manufacturing a semiconductor integrated circuit device. Since misalignment occurs during patterning, devices are generally designed to maintain an "alignment tolerance (margin)" in the portions connected by wiring.

In the manufacturing method described in the previously mentioned Japanese Laid-open Patent Application No. 11-261000, an insulating layer made of $SiO_2$ or the like must be formed around the ends of each of a plurality of units of through-wiring arranged at high density while maintaining alignment tolerance. This method therefore has drawbacks in that a technique of high-precision alignment is required in order to maintain the alignment tolerance. Furthermore, maintaining alignment tolerance around the ends of the through-wiring creates drawbacks in that the substantial surface area of the open portion of the through-wiring is decreased. This leads to the further drawback of increased resistance in the through-wiring portion.

DISCLOSURE OF THE INVENTION

An object of the present invention is to provide a semiconductor integrated circuit device and a method for manufacturing the same, whereby the degree of integration can be increased and the resistance can be reduced in the through-wiring portion without causing transistor characteristics to fluctuate in the manufacturing process.

According to a first aspect of the present invention, there is provided a semiconductor integrated circuit device which is used as one semiconductor layer of a layered semiconductor device and in which an integrated circuit is formed, the semiconductor integrated circuit device comprising, on a substrate, a semiconductor integrated circuit portion in which the integrated circuit is formed, through-wiring for electrically connecting the integrated circuit to an integrated circuit of another semiconductor layer, and a surrounding insulation portion for surrounding and insulating the through-wiring from the semiconductor integrated circuit portion.

The abovementioned semiconductor integrated circuit device is formed in a single semiconductor layer. In the semiconductor integrated circuit device formed in a single semiconductor layer, the surrounding insulation portion is provided between the semiconductor integrated circuit portion and the through-wiring in the substrate, and the insulation enables these components to be securely isolated from each other. This configuration prevents the transistor region of the semiconductor integrated circuit portion from being contaminated with the metal of the through-wiring portion during the manufacturing process, and enables a semiconductor integrated circuit device to be obtained that has good transistor characteristics.

According to the present invention, in a semiconductor integrated circuit device having a layered three-dimensional structure or other structure formed, for example, by one or a plurality of semiconductor layers, a surrounding insulation portion is provided between the semiconductor integrated circuit portion and the through-wiring, enabling these components to be securely isolated from each other. The step for forming the through-wiring in the manufacturing process is performed after the step for forming the surrounding insulation portion and the step for forming the semiconductor integrated circuit portion. It is therefore possible to reliably prevent the transistor region of the semiconductor integrated circuit portion in the semiconductor layer from being contaminated with the metal of the through-wiring portion during the manufacturing process, thus enabling a semiconductor integrated circuit device to be manufactured that has good transistor characteristics.

Since the semiconductor integrated circuit portion and the through-wiring are also insulated from each other by the surrounding insulation portion according to the present invention, it is sufficient to maintain a slight "alignment tolerance" only at the inner edge of the surrounding insulation portion, and there is no need to maintain an "alignment tolerance" around the ends of all of the units of through-wiring.

According to another aspect of the present invention, there is provided a semiconductor integrated circuit device which has a layered structure and comprises a plurality of semiconductor layers in which an integrated circuit is formed on a substrate, wherein each of the plurality of semiconductor layers comprises, on each substrate, a semiconductor integrated circuit portion in which the integrated circuit is formed, through-wiring for electrically connecting the integrated circuit to an integrated circuit of another semiconductor layer, and a surrounding insulation portion for surrounding and insulating the through-wiring from the semiconductor integrated circuit portion.

The abovementioned semiconductor integrated circuit device is formed, from a plurality of semiconductor layers and has a layered three-dimensional structure. In a layered semiconductor integrated circuit device formed from a plurality of semiconductor layers, a surrounding insulation portion is provided between the semiconductor integrated-circuit portion and the through-wiring, enabling these components to be securely isolated from each other in the substrate of each semiconductor layer. This configuration prevents the transistor region of the semiconductor integrated circuit portion in each semiconductor layer from being contaminated with the metal of the through-wiring portion during the manufacturing process. As a result, a semiconductor integrated circuit device can be obtained that has good transistor characteristics.

It is preferred in the abovementioned semiconductor integrated circuit device that the surrounding insulation, portion comprise an insulation body embedded in an insulation unit trench, and that the insulation body comprise any substance selected from the group consisting of silicon dioxide, silicon nitride, and polycrystalline silicon.

It is preferred in the abovementioned semiconductor integrated circuit device that the through-wiring comprise a metal embedded in a through-wiring trench formed in the substrate. This configuration makes it possible to use a metal conductor to form a plurality of units of through-wiring, for example, provided in the through-wiring portion, and to reduce the resistance of the through-wiring.

It is also preferred in the abovementioned semiconductor integrated circuit device that the metal include any metal selected from the group consisting of tungsten, copper, and aluminum.

It is also preferred in the abovementioned semiconductor integrated circuit device that an insulation film having a prescribed width of alignment tolerance be formed on a periphery of a lower end of the surrounding insulation portion on a back surface of the substrate. A prescribed width of alignment tolerance is thereby incorporated into the structure. As a result, it becomes possible to reduce the interval between units of through-wiring and increase the degree of integration, to simplify the manufacturing process, and to increase the area of the open portion of the through-wiring.

According to the present invention, the through-wiring is formed by embedding a metal conductor all along the inside of a through-wiring trench, and there is no need to provide an insulating film to the sidewalls. The degree of integration can therefore be even, further enhanced by reducing the interval between the units of through-wiring, and the process for manufacturing the "alignment tolerance" portion is simplified. Furthermore, the area of the open portion of the through-wiring can be increased, and it is possible to prevent an increase in the resistance of the through-wiring caused by the area of the open portion being too narrow.

As a result of utilizing a metal conductor for the through-wiring as described above in the semiconductor integrated circuit device according to the present invention, the resistance of the through-wiring is reduced, the operational speed of each device can be enhanced, and reduced power consumption and other effects can be obtained relative to the conventional technique of forming the through-wiring by embedding polysilicon or another nonmetal conductive substance in the trench.

Since there is no insulation film on the sidewalls of the through-wiring trench in the semiconductor integrated circuit device according to the present invention, the trench capacity can be utilized with high efficiency by the metal used for the through-wiring.

According to yet another aspect of the present invention, there is provided a method for manufacturing a semiconductor integrated circuit device, comprising a first step for forming an insulation unit trench in a substrate, and then embedding an insulation body inside the trench to form a surrounding, insulation portion; a second step for forming a semiconductor integrated circuit portion on the substrate; and a third step whereby through-wiring for creating an electrical connection with a semiconductor integrated circuit portion of another layer is formed inside the surrounding insulation portion; wherein the third step for forming the through-wiring inside the surrounding insulation portion is performed after the first step and the second step.

The manufacturing method described above is used to manufacture a semiconductor integrated circuit device composed of a single semiconductor layer. According to this manufacturing method, a first step for forming a surrounding insulation portion that involves high-temperature treatment (about 1000° C.), and a second step for forming a semiconductor integrated circuit portion are completed in a stage prior to execution of the third step whereby through-wiring for creating an electrical connection with a semiconductor integrated circuit portion of another layer is formed inside the surrounding insulation portion. It therefore becomes possible to eliminate metal contamination caused by the metal of the through-wiring diffusing into the transistor region.

According to yet another aspect of the present invention, there is provided a method for manufacturing a semiconductor integrated circuit device, comprising a first step for forming an insulation unit trench in a substrate, and then embedding an insulator inside the trench to form, a surrounding insulation portion; a second step for forming a semiconductor integrated circuit portion on the substrate, and a third step whereby through-wiring for creating an electrical connection with a semiconductor integrated circuit portion of another layer is formed inside the surrounding insulation portion, wherein the steps are performed in order to manufacture semiconductor layers; the method for manufacturing a semiconductor integrated circuit device further comprising a fourth step for layering a plurality of semiconductor layers provided with the surrounding insulation portion, the semiconductor integrated circuit portion, and the through-wiring from the first through third steps; wherein the third step for forming the through-wiring inside the surrounding wiring portion is performed after the first step and the second step.

The manufacturing method described above is used to manufacture a laminate-type semiconductor integrated circuit device composed of a plurality of semiconductor layers. In the manufacturing process for each semiconductor layer, a first step for forming a surrounding insulation portion that involves high-temperature treatment (about 1000° C.), and a second step for forming a semiconductor integrated circuit portion are completed in a stage prior to execution of the third step whereby through-wiring for creating an electrical connection with a semiconductor integrated circuit portion of another layer is formed inside the surrounding insulation portion. It therefore becomes possible to eliminate metal contamination caused by the metal of the through-wiring diffusing into the transistor region.

In the above-described methods for manufacturing a semiconductor integrated circuit device, any substance selected from the group consisting of silicon dioxide, silicon nitride, and polycrystalline silicon can be used as the insulation body, and the metal embedded in a through-wiring trench formed in the substrate in the step for forming the through-wiring is any metal selected from the group consisting of tungsten, copper, and aluminum.

The abovementioned method for manufacturing a semiconductor integrated circuit device may further comprise a fifth step for making the substrate thinner, and a sixth step for forming, in a periphery of a lower end of the surrounding insulation portion exposed by the fifth step for thickness reduction, an insulation film having a prescribed width of alignment tolerance, wherein the steps are performed after formation of the surrounding insulation portion, the semiconductor integrated circuit portion, and the through-wiring.

According to the manufacturing method of the present invention, since the step that involves high-temperature processing, is completed in a stage prior to the step for forming the through-wiring, there is no risk of metal contamination caused by the metal in the through-wiring diffusing into the transistor region. As a result, it is possible to prevent fluctuation in transistor characteristics due to metal contamination, and other defects.

BRIEF DESCRIPTION OF THE DRAWINGS

Certain preferred embodiments of the present invention will be described in detail below, by way of example only, with reference to the accompanying drawings, in which:

FIG. 6 is a flowchart showing the method for manufacturing a semiconductor integrated circuit device according to an embodiment of the present invention;

BEST MODE FOR CARRYING OUT THE INVENTION

Figure 1:
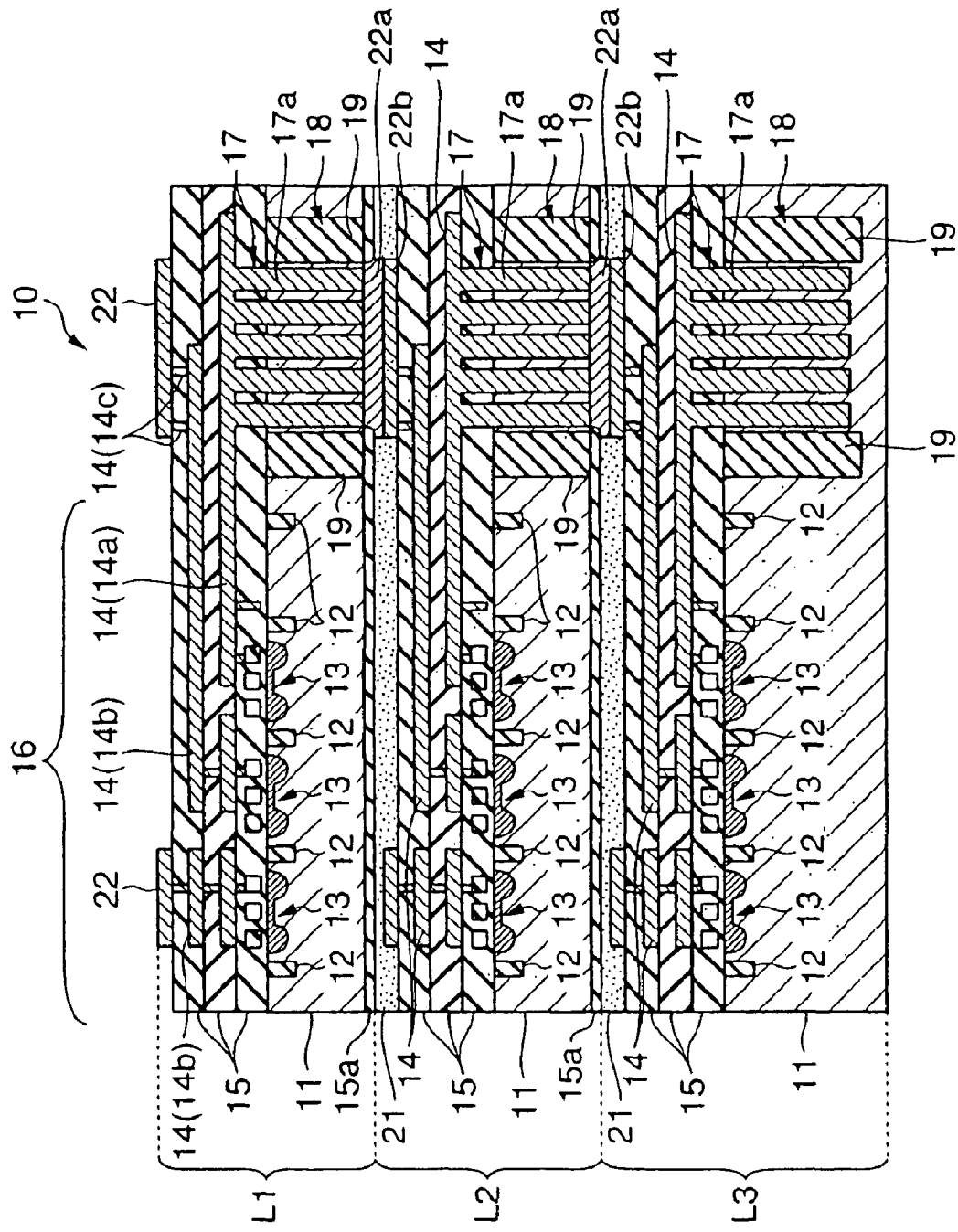
FIG. 1 is a longitudinal sectional view of the relevant portion of the semiconductor integrated circuit device according to an embodiment of the present invention.

FIG. 1 is a longitudinal sectional view of the relevant portion of the semiconductor integrated circuit device according to an embodiment of the present invention. The three-dimensional semiconductor integrated circuit device shown in FIG. 1 has a tiered structure in which are layered three semiconductor layers provided with semiconductor integrated circuits that have essentially the same circuit structure.

The semiconductor integrated circuit device 10 has, for example, a three-dimensional structure based on a three-layer tiered structure. Divided into constituent elements, each of the three semiconductor layers L1, L2, L3 forming the semiconductor integrated circuit device 10 is generally composed of a region of the semiconductor integrated circuit portion 16 and a region of the through-wiring portion 17.

The above-described semiconductor integrated circuit device 10 is referred to as a semiconductor integrated circuit device having a layered structure, but the semiconductor integrated circuit device 10 is not limited in concept to having a layered structure. A semiconductor integrated circuit device 10 formed from a single semiconductor layer is also included in the concept of the present invention.

In the semiconductor layers L1 to L3, the semiconductor integrated circuit portion 16 is composed of element separators 12 formed on a semiconductor substrate 11 that is a silicon substrate, a plurality of transistors and other elements 13, and other components. Elements that are adjacent to each other among the plurality of elements 13 on the semiconductor substrate 11 are electrically separated from each other by the element separators 12. The through-wiring portion 17 is composed of a plurality of units of through-wiring 17a, a surrounding insulation portion 18 provided to the periphery of the region in which the through-wiring 17a is formed, and other components.

The surrounding insulation portion 18 has an insulation body 19 embedded in a high-aspect-ratio (for example, an aspect ratio of about 25, and a depth of about 40 μm) trench (insulation unit trench) formed in the semiconductor substrate 11. The surrounding insulation portion 18 is provided to electrically insulate the semiconductor integrated circuit portion 16 and the through-wiring portion 17 from each other. The insulation body 19 of the surrounding insulation portion 18 is formed from silicon dioxide ($SiO_2$), for example. However, the material used to form the insulation body 19 is not limited to silicon dioxide, and silicon nitride, polycrystalline silicon, or another material may be used insofar as the material can adequately function as an insulator.

A plurality of units of through-wiring 17a is provided to the inside of the surrounding insulation portion 18 to form an electrical connection between semiconductor integrated circuits formed in different semiconductor layers. The plurality of units of through-wiring 17a surrounded by the same surrounding insulation portion 18 is connected to the same circuit portion (or element). Each through-wiring trench used for the plurality of units of through-wiring 17a differs from the insulation unit trench used for the surrounding insulation portion 18. The trenches used for the through-wiring 17a have a high aspect ratio; e.g., an aspect ratio of about 25, and a depth of about 40 μm. The through-wiring 17a is formed by embedding metal into the trenches used for the through-wiring 17a.

As a result of utilizing a metal in the through-wiring 17a as described above in the semiconductor integrated circuit device 10 according to the present embodiment, the resistance of the through-wiring portion 17 is reduced, the operational speed of each device can be enhanced, and reduced power consumption and other effects are obtained relative to the conventional technique of forming the through-wiring by embedding polysilicon or another nonmetal conductive substance in the trench.

Since there is no insulation film composed of $SiO_2$ or the like on the sidewalls of the trench used for the through-wiring 17a in the semiconductor integrated circuit device 10 according to the present embodiment, the trench capacity can be utilized with high efficiency by the metal used for the through-wiring. The through-wiring 17a may be composed of tungsten (W), copper (Cu), aluminum (Al) or the like, for example.

In each of the semiconductor layers L1 to L3, wiring 14 or an insulation layer 15 having a laminate structure, is provided on a semiconductor substrate 11. The wiring 14 is provided in order to form a connection between different elements 13 or a connection to the through-wiring 17a. The insulation layer 15 is provided mainly for insulation between units of wiring 14. The wiring 14 is composed of tungsten (W), copper (Cu), aluminum (Al), or the like, for example. The wiring 14 may be made of the same material as the through-wiring 17a, or may be made of a different material. The material for forming the through-wiring 17a or the wiring 14 is appropriately selected according to the cost, manufacturing process, or other circumstances of the semiconductor integrated circuit device 10. The wiring 14 in FIG. 1 is numbered according to the layered insulation layers 15 in sequence from the bottom, wherein the first-layer wiring is numbered 14a, the second-layer wiring is numbered 14b, and the third-layer wiring is numbered 14c.

The semiconductor layers L1 to L3 have bumps 22 in the portions that form the boundaries between the layers. The bump 22a provided to the lower surface (or back surface) of the semiconductor substrate 11 in the upper semiconductor layer is electrically connected to the units of through-wiring 17a of the through-wiring portion 17. The bump 22b provided to the upper surface of the insulation layer 15 of the lower semiconductor layer is connected to the wiring 14 inside the insulation layer 15. When two semiconductor layers are stacked vertically, the semiconductor integrated circuit portions 16 of the semiconductor layers are electrically connected by the electrical connection formed between the bump 22a of the upper semiconductor layer and the bump 22b of the lower semiconductor layer. The bumps 22a, 22b are formed from a gold-indium alloy or the like, for example, by photolithography or metal vapor deposition.

An adhesive 21 having insulating properties is injected into the space formed between the three semiconductor layers (L1, L2, L3) joined by the bumps 22a, 22b, thereby completing the semiconductor integrated circuit device 10.

An example is shown in FIG. 1 in which there are three semiconductor layers L1 to L3, and one through-wiring portion 17 and one surrounding insulation portion 18 are provided to each semiconductor layer. However, the semiconductor integrated circuit device 10 may also be manufactured so as to have a different number of semiconductor layers, through-wiring portions 17, and other components. The number of layers of wiring 14 or units of through-wiring 17a constituting the through-wiring portion 17 is also not limited by the representation in FIG. 1. These numbers of components are appropriately determined according to the number of elements, size, degree of integration, operating characteristics, and other properties of the semiconductor integrated circuit device 101.

Figure 2:
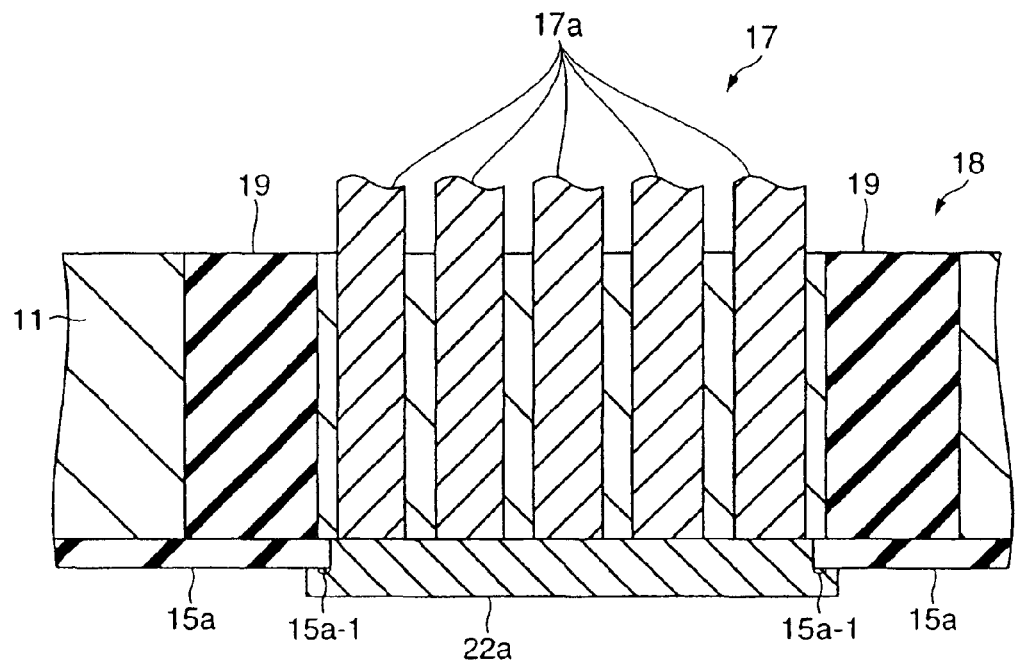
FIG. 2 is an enlarged longitudinal sectional view of a portion of FIG. 1 for describing the "alignment tolerance" in the semiconductor integrated circuit device according to the present embodiment.

FIG. 2 is an enlarged view of the portion near the through-wiring portion 17 in FIG. 1, showing the structure of the lower surface portion (back surface portion) of the semiconductor substrate 11 of the uppermost semiconductor layer L1, for example. FIG. 2 is used to describe the "alignment tolerance" in the semiconductor integrated circuit device 10. In FIG. 2, an insulation film 15a is formed on the lower surface (back surface) of the semiconductor substrate 11. As shown in FIG. 2, misalignment in patterning is assumed, and the insulation film 15a is provided so as to extend towards the through-wiring portion 17 by an amount equal to a prescribed alignment tolerance 15a-1. The size of the alignment tolerance 15a-1 is appropriately determined according to the precision of processing performed by an exposure device, the degree of integration of the semiconductor integrated circuit device 10, or another factor. In FIG. 2, reference numeral 11 indicates the semiconductor substrate, 17a indicates through-wiring, 18 indicates the surrounding insulation portion, and 22a indicates the bump, and other components are not shown. The structure described above is also the same on the lower surface of the semiconductor layer L2.

As shown in FIG. 2, since the semiconductor integrated circuit portion 16 and the through-wiring portion 17 are insulated from each other by the surrounding insulation portion 18 in the structure of the present embodiment, it is sufficient for a slight "alignment tolerance" to be maintained only at the inner edge of the surrounding insulation portion 18, and there is no need to maintain an "alignment-tolerance" around the ends of all of the units of through-wiring 17a. The through-wiring 17a is also formed by embedding a metal all along the inside of a trench used for through-wiring 17a, and there is no need to provide an insulating film composed of $SiO_2$ or the like to the sidewalls. The degree of integration can therefore be even further enhanced by reducing the interval between the units of through-wiring 17a, and the process for manufacturing the "alignment tolerance" portion is simplified. Furthermore, since the area of the open portion of the through-wiring 17a can be increased, it is also possible to prevent an increase in the resistance of the through-wiring portion 17 caused by an excessively narrow area of the open portion.

Figure 3:
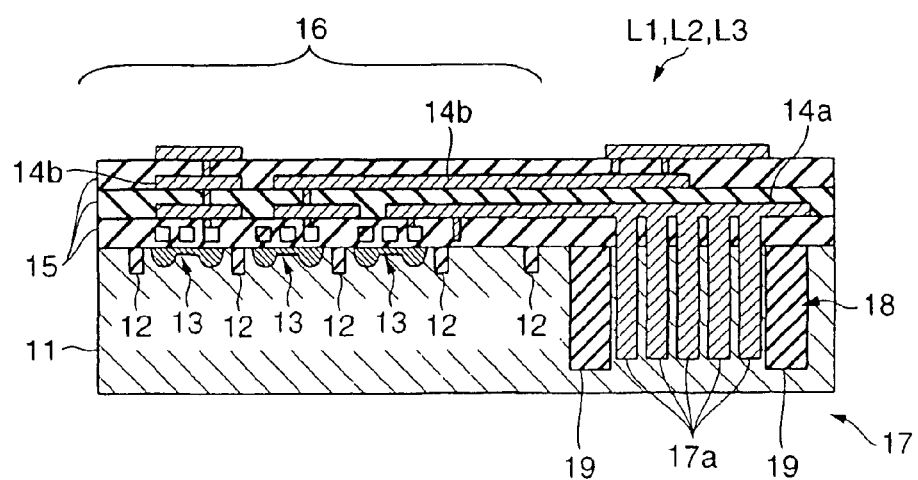
FIG. 3 is a longitudinal sectional view showing the cross-sectional structure in an intermediate stage of manufacturing one of the layers constituting the semiconductor integrated circuit device of the present embodiment.

FIG. 3 is a separate view of one of the semiconductor layers L1, L2, L3 of the semiconductor integrated circuit device 10 shown in FIG. 1. FIG. 3 shows a semiconductor layer in the process of a film thinning treatment for removing a portion of the lower surface of the semiconductor substrate 11. Accordingly, FIG. 3 shows a state in which the through-wiring 17a is not yet exposed on the lower surface of the semiconductor substrate 11. The same reference symbols are used in FIG. 3 to indicate elements that are essentially the same as the elements shown in FIG. 1.

Although shown in simplified form in FIGS. 1 and 3, semiconductor integrated circuit portions 16 and through-wiring portions 17 exist in various numbers and positions on a silicon wafer during the actual; manufacturing process of the semiconductor integrated circuit device 10.

Figure 4:
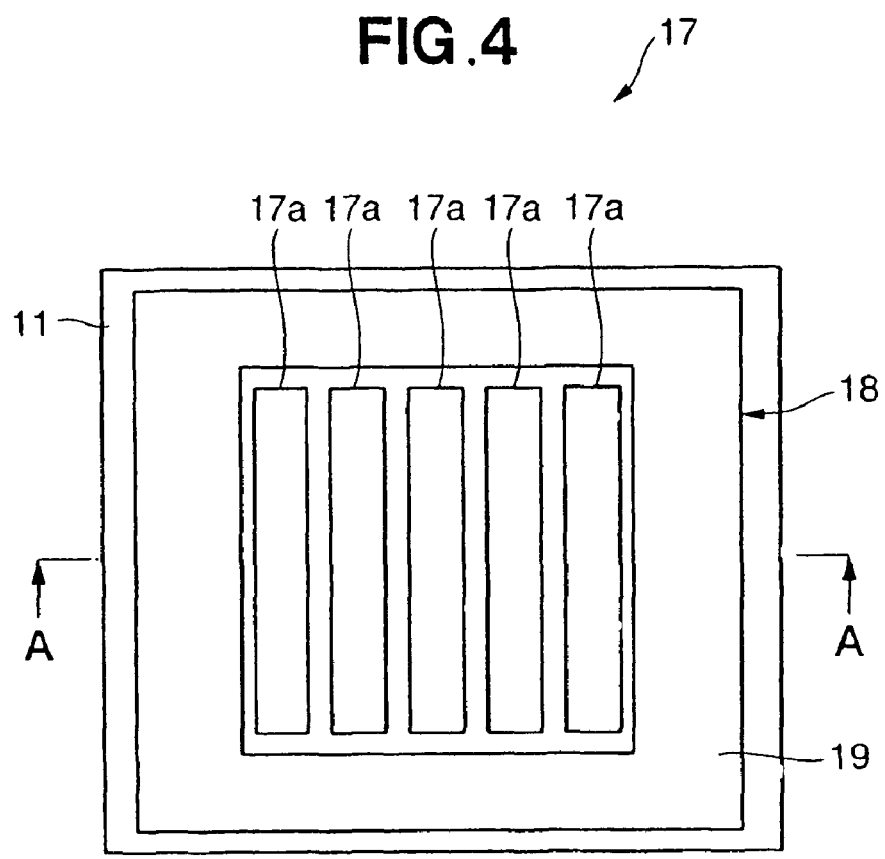
FIG. 4 is a plan view showing the planar structure of the substrate region of a through-electrode portion.
Figure 5:
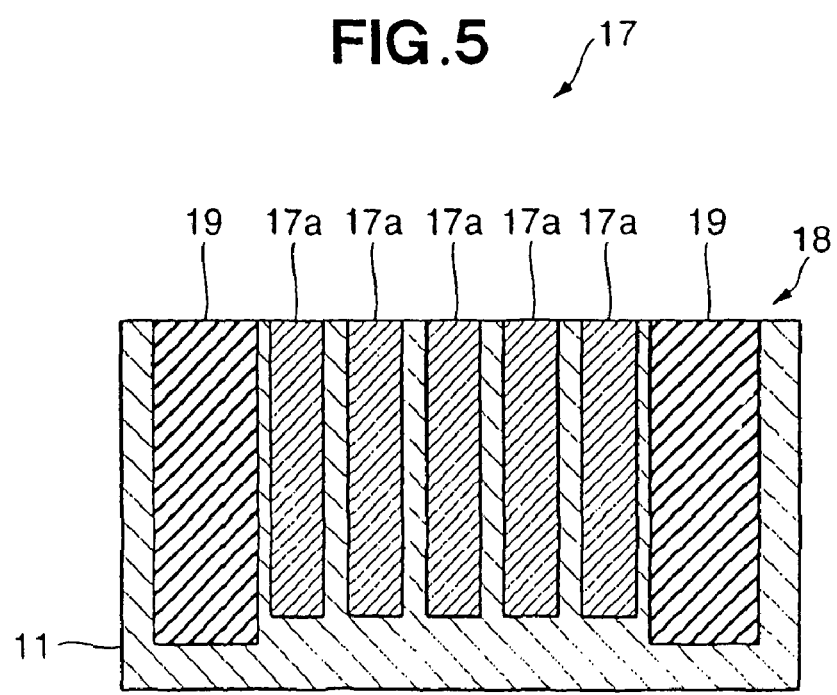
FIG. 5 is a sectional view along line A-A in FIG. 4.

FIG. 4 is a plan view showing the substrate regions of the through-wiring portion 17 and surrounding insulation portion 18 in the semiconductor layer shown in FIG. 3, and FIG. 5 is a sectional view along line A-A in FIG. 4. The planar shape of each of the plurality of units of through-wiring 17a is rectangular, and the dimensions thereof are 1.5 μm by 5.6 μm, for example.

As shown in FIG. 4, the surrounding insulation portion 18 rectangularly surrounds the through-wiring portion 17. The values set for the distance between units of through-wiring 17a or the shape and size of the through-wiring 17a are set according to the number of elements of the semiconductor integrated circuit device 10, the technique for forming the trenches, the exposure technique, the manufacturing cost constraints, manufacturing time, and other factors so as to adequately enable these processes to be performed, and to provide a high degree of integration. The shape or size of the surrounding insulation portion 18, the distance thereof from nearby through-wiring 17a, and other specifications may be set so as to enable trench formation and other processes to be performed, to ensure insulation between the semiconductor integrated circuit portion 16 and the through-wiring portion 17, and to enable a high degree of integration to be obtained. A round planar shape, for example, may be adopted as the shape of the surrounding insulation portion 18.

The top of the through-wiring 17a (upper surface side of the semiconductor substrate 11 shown in FIG. 3) is not necessarily positioned at the same height as the surrounding insulation portion 18, and may extend, for example, to a height equal to that of an interlayer insulation film 15 that is higher than the semiconductor substrate 11. For the metal material embedded into the trench used for through-wiring 17a, a material may be selected that has a high degree of adhesion to the silicon substrate 11, and that has low resistance appropriate for the manufacturing process of the semiconductor integrated circuit device 10.

The method for manufacturing the above-mentioned semiconductor integrated circuit device 10 will next be described with reference to FIGS. 6, 7A through 7D, 8A through 8D, and 9A through 9C.

FIG. 6 is a flowchart showing the method for manufacturing the semiconductor integrated circuit device 10. As shown in FIG. 6, all of the steps of this manufacturing method can be generally divided into a step S10 for forming a surrounding insulation portion 18, a step S20 for forming a semiconductor integrated circuit portion 16 and through-wiring 17a, and a step S30 for vertically layering a plurality of semiconductor layers L1, L2, L3. In this manufacturing method, step S10, step S20, and step S30 are executed in this sequence.

Figure 7A:
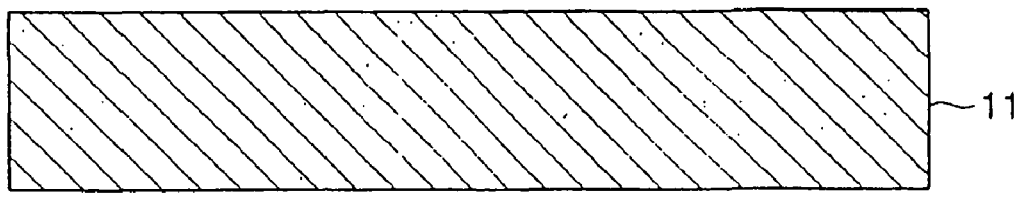
FIGS. 7A through 7D are longitudinal sectional views showing state transitions of the semiconductor substrate in the step for forming the surrounding insulation portion.
Figure 7B:
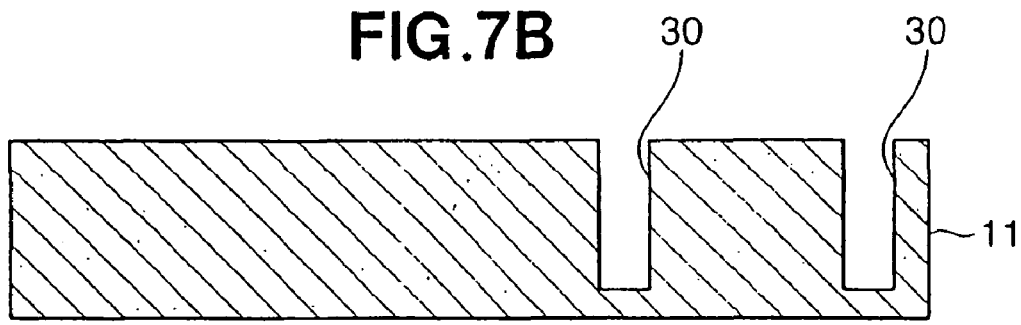

FIGS. 7A through 7D show state transitions of the semiconductor substrate 11 in step S10 for forming the surrounding insulation portion 18; FIGS. 8A through 8D show state transitions of the semiconductor substrate 11 in step S20 for forming the semiconductor integrated circuit portion 16 and the through-wiring 17a; and FIGS. 9A through 9C show state transitions of the semiconductor substrate 11 in step S30 for vertically layering the plurality of semiconductor layers L1, L2, L3.

The manufacturing method will be described hereinafter according to the flowchart shown in FIG. 6 and with reference to the process states of the substrate shown in FIGS. 7A through 7D, 8A through 8D, and 9A through 9C.

Step S10 for forming the through-wiring portion 17 is executed first. In a sub-step S11 performed first in step S10, a plurality of silicon semiconductor substrates 11 is prepared (FIG. 7A), and insulation unit trenches 30 are formed by plasma etching using a mask having openings in the positions in which the insulation unit trenches (deep grooves) are formed (FIG. 7B).

Figure 7C:
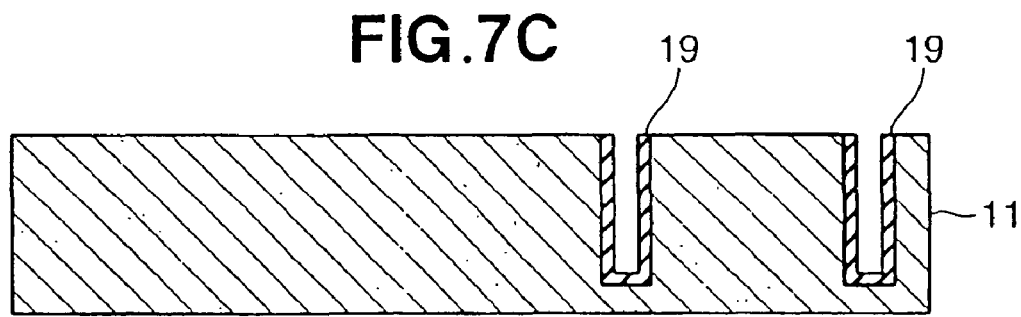
Figure 7D:
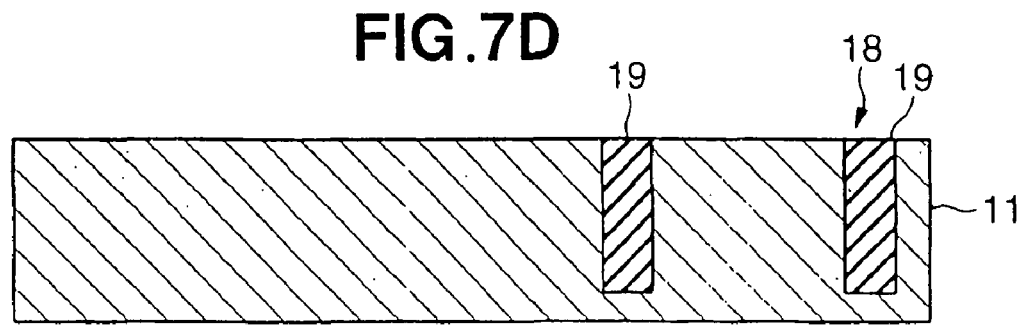
Figure 8A:
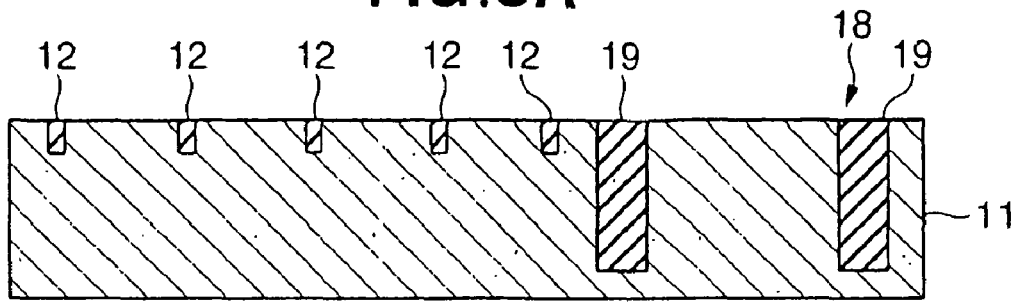
FIGS. 8A through 8D are longitudinal sectional views showing state transitions of the semiconductor substrate in the steps for forming the semiconductor integrated circuit portion and the through-wiring portion.

In a subsequent sub-step S12, the semiconductor substrate 11 is heat-oxidized at a high temperature of about 1000° C., CVD or another treatment is performed, and an insulation body is filled into the trenches 30 (FIG. 7C). The surrounding insulation portion 18 is thereby completed (FIG. 7D).

Step S20 for forming a semiconductor integrated circuit portion 16 and through-wiring 17a is then executed. In a sub-step S21 performed first, in step S20, grooves are formed in prescribed positions using a known etching treatment, after which an insulator composed of $SiO_2$ or the like is deposited by CVD to form element separators 12 (FIG. 8A).

Figure 8B:
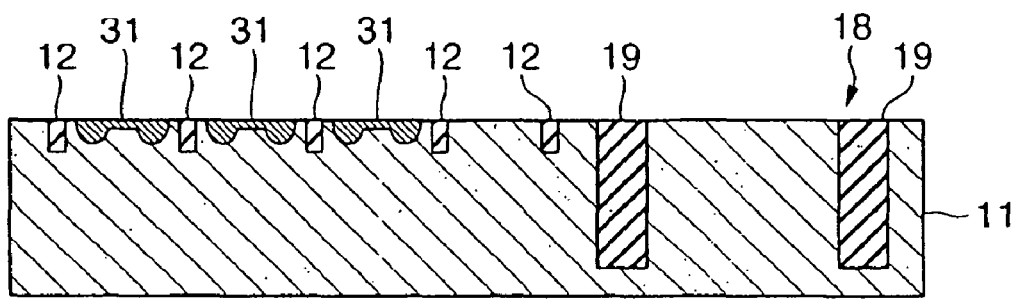
Figure 9A:
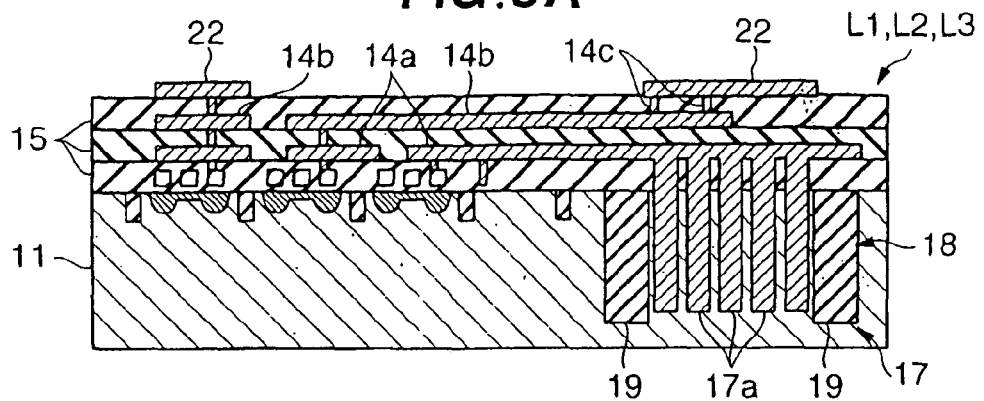
FIGS. 9A through 9C are longitudinal sectional views showing state transitions of the semiconductor substrate in the step for vertically layering the plurality of semiconductor layers.
Figure 9B:
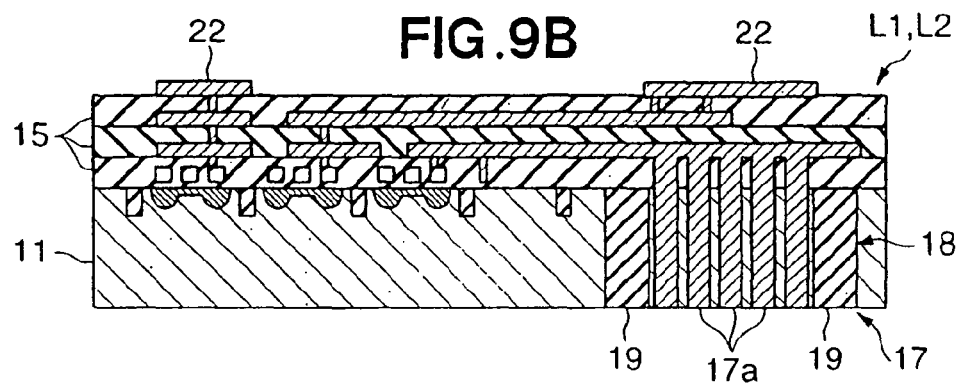
Figure 9C:
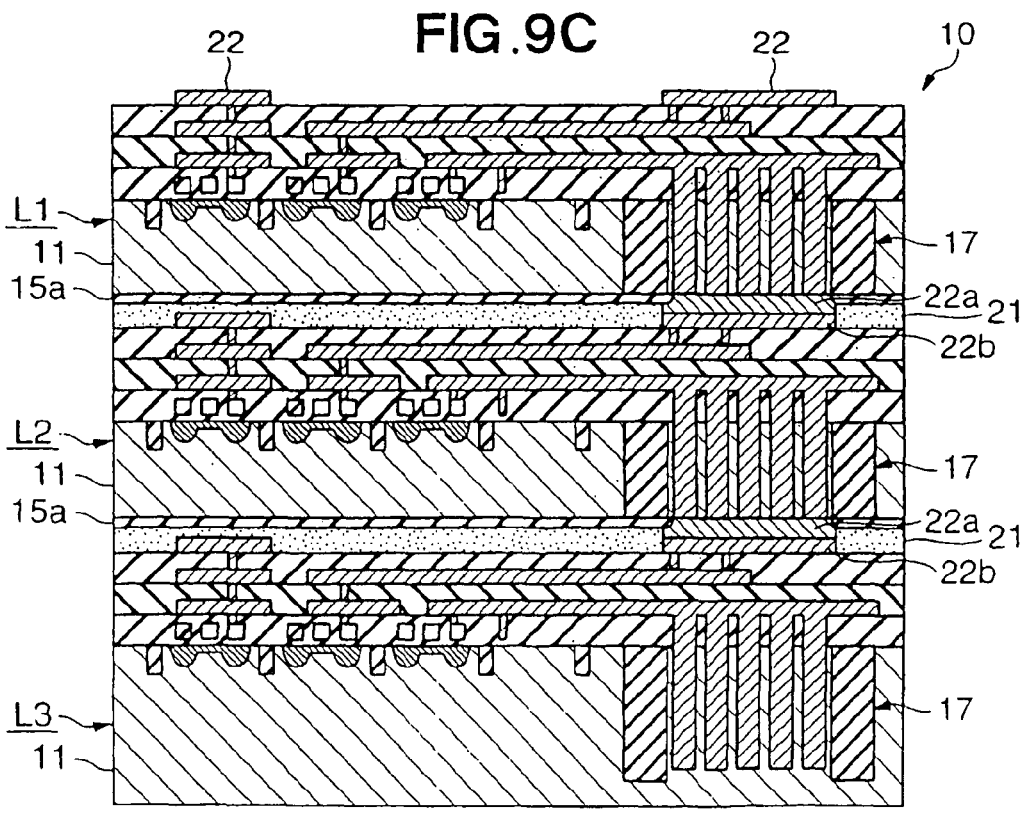

In a subsequent sub-step S22, prescribed regions for element formation are doped by ion implantation using boron ions or arsenic ions as an impurity to form diffusion layers 31 (FIG. 8B).

Figure 8C:
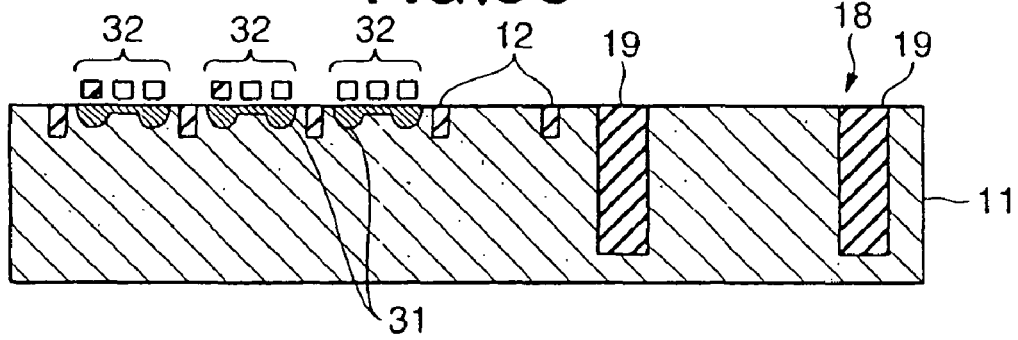

In another sub-step S23, CVD, sputtering, or the like are performed to form a plurality of electrodes 32 on the semiconductor substrate 11 that include a gate electrode, a source electrode, and a drain electrode (FIG. 8C). The plurality of elements 13 shown in FIG. 1 is thereby completed.

In a process for creating multilayer wiring as a subsequent sub-step S24-1, a known wiring fabrication method is used to form first-layer wiring 14a in the semiconductor integrated circuit portion 16.

After the first-layer wiring 14a is formed, step S25 for forming through-wiring 17a is performed. This step S25 is composed of two sub-steps S25-1, S25-2. In step S25, a plurality of through-wiring trenches is first formed in prescribed positions by plasma etching in sub-step S25-1. In the subsequent sub-step S25-2, CVD or sputtering is performed to fill a metal conductor composed of tungsten or the like, for example, into the through-wiring trenches.

Figure 8D:
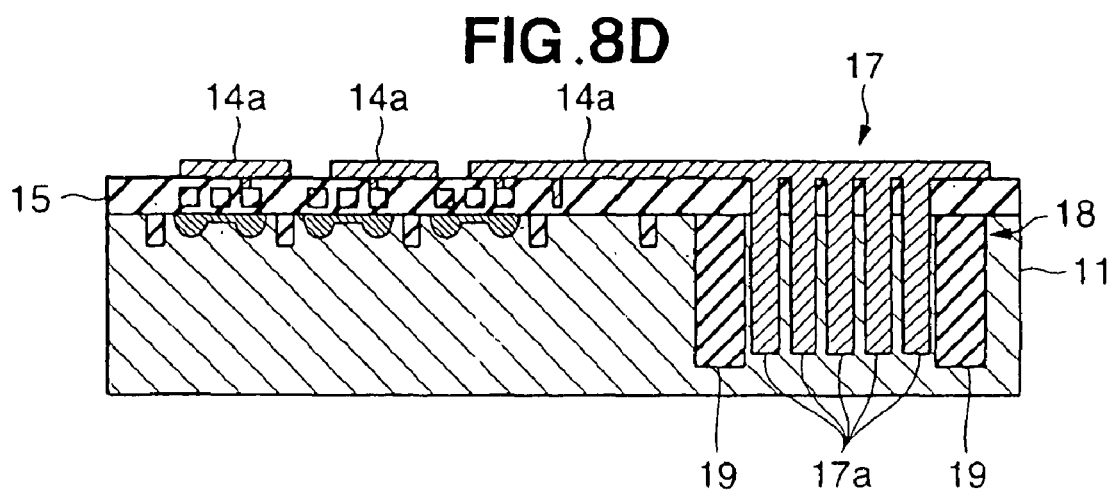

A plurality of units, of through-wiring 17a is completed by step S25 as described above (FIG. 8D). Step S25 is performed as an intermediate process of step S20 in the present embodiment. FIG. 8D shows a state in which the insulation layer 15 and the wiring 14a are already formed.

Second-layer wiring 14b and third-layer wiring 14c are then formed on the upper side of the first-layer wiring 14a using basically the same method as was used to form the wiring 14a. The wirings are formed by sub-steps S24-2, S24-3 subsequent to step S25 for forming the through-wiring 17a. The final completed state of the semiconductor layer is shown in FIG. 9A.

The number or sequence of processes for creating multi-layer wiring is determined with consideration for the number of wiring layers, which is determined by the degree of integration, the number of layers, and other characteristics of the semiconductor integrated circuit device 10. Step S25 for forming the through-wiring 17a may also be performed prior to sub-step S24-1, or subsequent to sub-step S24-2 or sub-step 24-3.

Step S30 is then performed to vertically layer the plurality of semiconductor layers L1, L2, L3. In a sub-step S31 of step S30, the thickness of the semiconductor layers (L1, L2) shown in FIG. 9A is first reduced by grinding/polishing the back surface of the semiconductor substrate 11 using a known CMP (Chemical Mechanical Polishing) or another method (FIG. 9B). The bottom semiconductor layer L3 is left in the unprocessed state shown in FIG. 9A. Interlayer insulation films 15a composed of $SiO_2$ are then formed in sub-step S32 on the back surfaces (lower surface side of semiconductor substrate 11 shown in FIG. 9B) of the semiconductor substrates 11 of semiconductor layers L1, L2 while maintaining a prescribed "alignment tolerance." In this sub-step S32, the interlayer insulation films 15a are formed after first turning-over the semiconductor, substrates 11.

In a subsequent sub-step S33, an opening is formed for allowing a connection to the through-wiring 17a and other components, after which sputtering, vapor deposition, or another method is used to provide a bump 22 composed of gold-indium alloy, for example, to the opening. In sub-step S34 described hereinafter, the semiconductor substrates 11 of the semiconductor layers L1 to L3 are vertically layered, but the same process as in sub-step S33 is performed in advance to form a bump 22 also on the upper surface of the semiconductor substrate 11 positioned on the lower side during layering.

It is preferred that the thickness reduction treatment for the semiconductor substrate 11 be performed using a combination of a plurality of techniques according to thickness. For example, when the thickness is reduced to about 40 μm, the surface of the semiconductor substrate 11 is fixed by a glass substrate not shown in the drawing, after which grinding is performed, with a grindstone until the thickness is about 5 to 10 μm greater than the target, thickness of 40 μm, and then a polishing treatment is performed to reduce the thickness to the desired value. Polishing treatment is performed last so as to remove minute damage (specifically, crystal defects, strain, and the like) to the silicon substrate caused by grinding using a grindstone. This damage removal process is called "stress relief." The substrate on which the semiconductor substrate 11 being thinned is fixed is not limited to a glass substrate, and a sapphire substrate or other substrate may also be used.

In sub-step S34 shown in FIG. 6, the plurality of semiconductor layers (L1, L2, L3) formed by the processes performed through sub-step S33 is vertically layered while infrared rays are used to ensure high-precision alignment, the bumps 22 facing each other on upper and lower layers are bonded together, and an epoxy-resin-based adhesive 21, for example, is injected between the upper and lower semiconductor layers to complete the semiconductor integrated circuit device 10 (FIG. 8C).

The order of processing in step S10 and sub-step S21 may be reversed in the flowchart shown in FIG. 6. Other methods that produce the same effects may also be substituted for the sputtering, CVD, plasma etching, and various other treatment methods described in the abovementioned sub-steps.

Among the processes shown in FIG. 6, the following processes in particular involve treatments at high-temperatures of about 1000° C.: sub-step S12 (sidewall oxidation of trenches 30 used for the surrounding insulation portion 18), sub-step S13 (embedding of insulation body 19 into trenches 30), S21 (formation of element separators 12), and sub-step S22 (formation of diffusion layers).

According to the manufacturing method of the present embodiment, since the high-temperature treatment steps S12, S13, S21, and S22 are completed in a stage prior to step S25 for forming the through-wiring portion 17, there is no risk of metal contamination caused by the metal in the through-wiring 17a diffusing into the transistor region. As a result, the manufacturing method according to the present embodiment is capable of preventing fluctuation in transistor characteristics due to metal contamination and other defects.

Furthermore, according to the manufacturing method of the present embodiment, the metal through-wiring 17a is formed after the transistors are formed. The type of metal material that can be selected for use in the through-wiring is therefore not as limited as in the aforementioned conventional technique. Since the through-wiring 17a is composed of a metal, through-wiring 17a can be created that has lower resistance than wiring made of a nonmetal conductor such as polysilicon. There is also no need to perform high-temperature oxidation of sidewalls used for the through-wiring 17a after the transistors are formed, and there is therefore no re-diffusion of the impurity of the transistor region caused by the high-temperature oxidation treatment.

The manufacturing method according to the present embodiment contributes to even higher degrees of integration and simplification of the manufacturing process by creating a structure for a three-dimensional semiconductor integrated circuit in which a trench having a high aspect ratio is formed, and a metal is directly deposited into the trench without providing an insulation film.

In FIGS. 1 and 9C referred to in connection with the aforementioned embodiment, the semiconductor integrated circuit device 10 has a tiered structure in which the three layers that include the semiconductor layers L1, L2, L3 are layered together. Assuming a case in which the semiconductor integrated circuit device 10 is completed by only these three layers, it becomes unnecessary to form a bump 22 on the surface of the uppermost semiconductor layer L1, or to reduce the thickness or form the through-wiring portion 17 in the lowermost semiconductor layer L3.

The configuration, shape, size, and arrangement described in the examples above provides an outline that allows the present invention to be understood and implemented, and numbers and compositions (materials) of configurations are merely examples. Therefore, the present invention is not limited to the examples described above, and various modifications can be made within a scope that does not depart from the spirit of the claims.

INDUSTRIAL APPLICABILITY

The present invention is useful particularly in the manufacture of a three-dimensional semiconductor integrated circuit.

The invention claimed is:

1. A semiconductor integrated circuit device, comprising:
a substrate, the substrate having an upper surface and a lower surface;
a semiconductor integrated circuit portion formed in the substrate;
a first insulating layer formed on top of the substrate;
a first wiring layer formed on top of the first insulating layer;
a plurality of through wires extending downwardly from a bottom surface of the first wiring layer;
a first conductive bump on the bottom surface of the substrate, the plurality of through wires electrically connected to the first conductive bump; and
a surrounding insulation portion for surrounding and insulating the plurality of through wires from the semiconductor integrated circuit portion, the surrounding insulation portion extending downwardly from the upper surface of the substrate,
wherein the plurality of through wires are spaced from one another.

2. The semiconductor integrated circuit device of claim 1, wherein
the surrounding insulation portion comprises an insulation body embedded in an insulation unit trench; and
the insulation body comprises any substance selected from the group consisting of silicon dioxide, silicon nitride, and polycrystalline silicon.

3. The semiconductor integrated circuit device of claim 1, wherein the plurality of through wires comprises a metal embedded in a through-wiring trench formed in the substrate.

4. The semiconductor integrated circuit device of claim 3, wherein the metal includes any metal selected from the group consisting of tungsten, copper, and aluminum.

5. The semiconductor integrated circuit device of claim 1, wherein an insulation film having a prescribed width of alignment tolerance is formed on a periphery of a lower end of the surrounding insulation portion on a back surface of the substrate.

6. The semiconductor integrated circuit device of claim 1, further comprising:
a second conductive bump on the top surface of the substrate, the first wiring layer electrically connected to the second conductive bump.

7. The semiconductor integrated circuit device of claim 1, further comprising an adhesive layer forming an uppermost layer.

8. The semiconductor integrated circuit device of claim 1, wherein the first wiring layer and the plurality of through wires are integrally formed.

9. The semiconductor integrated circuit device of claim 1, further comprising electrodes in the first insulating layer.

10. The semiconductor integrated circuit device of claim 1, further comprising a second wiring layer, a portion of the second wiring layer vertically aligned with the through wires.

11. A semiconductor integrated circuit device, comprising:
a plurality of layers, each layer comprising:
a substrate, the substrate having an upper surface and a lower surface;
a semiconductor integrated circuit portion formed in the substrate;
a first insulating layer formed on top of the substrate;
a first wiring layer formed on top of the first insulating layer;
a plurality of through wires extending downwardly from a bottom surface of the first wiring layer;
a first conductive bump on the bottom surface of the substrate, the plurality of through wires electrically connected to the first conductive bump; and
a surrounding insulation portion for surrounding and insulating the plurality of through wires from the semiconductor integrated circuit portion, the surrounding insulation portion extending downwardly from the upper surface of the substrate,
wherein the plurality of through wires are spaced from one another.

12. The semiconductor integrated circuit device of claim 11, wherein
the surrounding insulation portion comprises an insulation body embedded in an insulation unit trench; and
the insulation body comprises any substance selected from the group consisting of silicon dioxide, silicon nitride, and polycrystalline silicon.

13. The semiconductor integrated circuit device of claim 11, wherein the plurality of through wires comprises a metal embedded in a through-wiring trench formed in the substrate.

14. The semiconductor integrated circuit device of claim 11, wherein an insulation film having a prescribed width of alignment tolerance is formed on a periphery of a lower end of the surrounding insulation portion on a back surface of the substrate.

15. The semiconductor integrated circuit device of claim 11, further comprising:
a second conductive bump on the top surface of the substrate, the first wiring layer electrically connected to the second conductive bump.

16. The semiconductor integrated circuit device of claim 11, further comprising an adhesive layer formed between the layers.

17. The semiconductor integrated circuit device of claim 11, wherein the first wiring layer and the plurality of through wires are integrally formed.

18. The semiconductor integrated circuit device of claim 11, further comprising electrodes in the first insulating layer.

19. The semiconductor integrated circuit device of claim 11, further comprising a second wiring layer, a portion of the second wiring layer vertically aligned with the through wires.

* * * * *